United States Patent
Pichler et al.

(10) Patent No.: US 7,800,428 B2
(45) Date of Patent: Sep. 21, 2010

(54) SEMICONDUCTOR DEVICE AND METHOD FOR CONTROLLING A SEMICONDUCTOR DEVICE

(75) Inventors: Joachim Pichler, Landskron (AT); Maria Giovanna Lagioia, Villach (AT)

(73) Assignee: Infineon Technologies AG, Munich (DE)

( * ) Notice: Subject to any disclaimer, the term of this patent is extended or adjusted under 35 U.S.C. 154(b) by 622 days.

(21) Appl. No.: 11/593,152

(22) Filed: Nov. 3, 2006

(65) Prior Publication Data

US 2008/0122517 A1    May 29, 2008

(51) Int. Cl.
*H03K 17/60* (2006.01)
(52) U.S. Cl. .................. 327/478; 327/482; 327/487; 327/488; 257/565; 257/567; 257/568; 257/570
(58) Field of Classification Search ................ 327/382, 327/478, 482, 483, 487, 488; 257/565, 567, 257/568, 570
See application file for complete search history.

(56) References Cited

U.S. PATENT DOCUMENTS 4,590,389 A * 5/1986 Cave et al. .................. 327/382
4,755,694 A * 7/1988 Bodig et al. ................. 327/483
6,465,768 B1 10/2002 Ker et al.
6,492,710 B1 12/2002 Watt
6,809,376 B2 10/2004 Kitamura
2006/0151783 A1 7/2006 Otani

FOREIGN PATENT DOCUMENTS

| | | |
|---|---|---|
| DE | 103 56 759 A1 | 12/2004 |
| JP | 1212463 A | 8/1989 |
| JP | 03205877 A | 9/1991 |
| JP | 2000011673 A | 1/2000 |
| WO | WO 96/21275 | 7/1996 |

* cited by examiner

*Primary Examiner*—Long Nguyen
(74) *Attorney, Agent, or Firm*—Maginot, Moore & Beck

(57) ABSTRACT

Semiconductor devices and methods are disclosed wherein a switching element or a current path is coupled to a substrate, and wherein a further element is coupled to said substrate and a control input of said switching element or said current path. Accordingly, in at least one embodiment, a semiconductor device comprises a substrate and a switching element with a control input coupled to the substrate. The semiconductor device includes a compensation element having a control input and an output. The control input of the compensation element is coupled to the substrate and the output of the compensation element is coupled to the control input of the switching element.

17 Claims, 2 Drawing Sheets

SEMICONDUCTOR DEVICE AND METHOD FOR CONTROLLING A SEMICONDUCTOR DEVICE

BACKGROUND OF THE INVENTION

The present invention relates to a semiconductor device and a method for controlling such a semiconductor device.

SUMMARY

A semiconductor device comprises a substrate having a first polarity. A first well and a second well are formed in the substrate. The first well and the second well have a second polarity different from the first polarity. A first bipolar transistor is formed in the first well with the first well forming the base of the first bipolar transistor. A second bipolar transistor formed in the second well, with the second well forming the base of the second bipolar transistor. A collector of the first bipolar transistor is connected to the base of the second bipolar transistor.

Further, a switching device comprises a circuit node and a first switch coupled between the circuit node and a first supply voltage. A switching element with a control input is coupled between the circuit node and a second supply voltage. A second switch is coupled to the control input of the switching element. The switching device further comprises a substrate wherein the control input of the switching element is coupled to the substrate. A compensation element is provided including a control input and an output. The control input of the compensation element is coupled to the substrate and the output of the compensation element is coupled to the control input of the switching element.

In at least one embodiment, the switching element of the switching device comprises a first transistor and a second transistor. A control input of the second transistor is coupled to the control input of the switching element. Also, a control input of the first transistor is coupled to a first contact of the second transistor, and a first contact of the first transistor is coupled to the circuit node. Further, a second contact of the first transistor and a second contact of the second transistor are coupled to said second supply voltage.

In another at least one embodiment, the compensation element of the switching device comprises a third transistor. In such embodiment, a control input of the third transistor is coupled to the substrate and to the first supply voltage. A first contact of the third transistor is coupled with a set control input of the switching device. A second contact of the third transistor is coupled with the second supply voltage.

In yet another at least one embodiment, the control input of the switching element is coupled with the second supply voltage via a resistor. Also, the control input of the third transistor is coupled to the second supply voltage via a further resistor.

The above described features and advantages, as well as others, will become more readily apparent to those of ordinary skill in the art by reference to the following detailed description and accompanying drawings.

BRIEF DESCRIPTION OF THE SEVERAL VIEWS OF THE DRAWINGS

Embodiments of the present invention will be described in the following with reference to the annexed drawings which are given as an example only and which are not to be construed as limiting the scope of the present invention, wherein.

DETAILED DESCRIPTION

Figure 1:
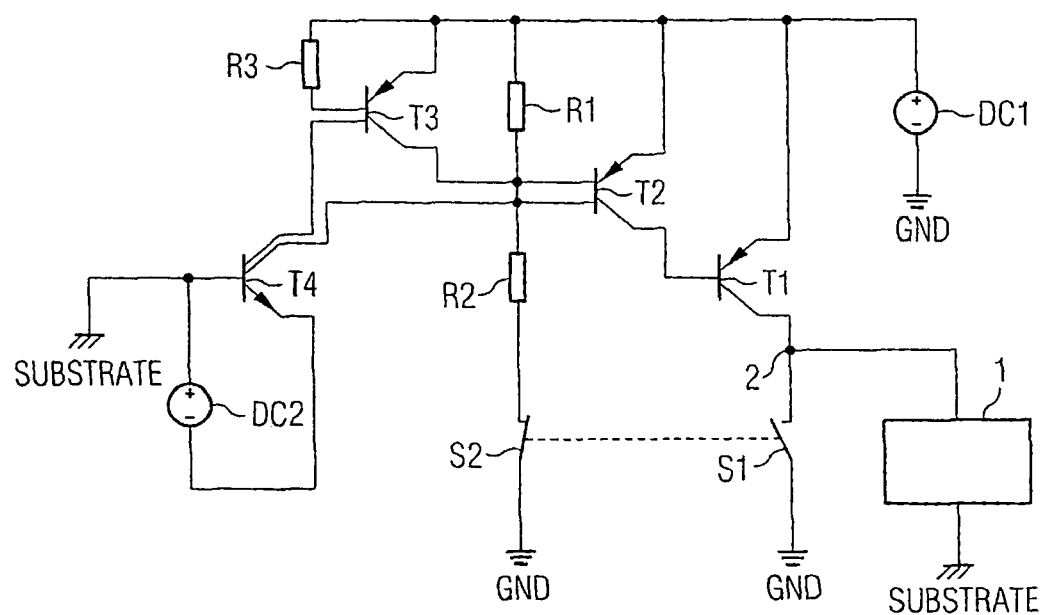
FIG. 1 is a circuit diagram of an embodiment.

In the following, embodiments of semiconductor devices and of methods for controlling a switching element or a current path in a semiconductor device are discussed. The semiconductor devices according to the embodiments which will be described in the following have a substrate, wherein circuit elements of the semiconductor are formed by forming correspondingly doped regions on the substrate to form for example diodes, transistors and the like. As a matter of course, additional elements like field oxides for forming MOS elements, resistors, capacitors, metal connections and the like may also be present.

In embodiments of the present invention, for realizing the above-mentioned circuit elements so-called wells may be formed in the substrate, said wells being doped regions surrounding the region where the circuit element is formed. The wells, in embodiments of the invention, may also constitute a part of a circuit element.

For example, n-doped wells may be provided in a p-type substrate. In this case, the pn junction thus formed also serves for insulating the respective circuit element against the substrate. Other insulation techniques which may be used in embodiments of the present invention include the use of silicon on insulator (SOI) substrates or providing multiple wells one in another for enhancing the isolation.

In general, when wells or other doped regions are formed in a substrate, so-called parasitic circuit elements may be formed. For example, if two n wells, i.e. n-doped regions, are formed in a p-type substrate, a parasitic npn bipolar transistor is formed. In case, for some reason, the substrate is biased positive with respect to the wells, this parasitic transistor becomes conducting which may lead to undesired cross currents. These cross currents in general may then lead to switching elements like transistors being opened which enables further current paths in the semiconductor device to conduct current. This, in turn, may lead to an increased power dissipation, malfunction of the semiconductor device or even destruction thereof.

In embodiments of the present invention, a compensation element is provided coupled to the above-mentioned switching element and to the substrate. When the above-mentioned situation occurs, the compensation element controls the switching element not to open even when a substrate is biased such that the switching element would open due to cross currents. Therefore, these embodiments reduce a power loss.

In embodiments of the present invention, the compensation element is a transistor, for example a lateral bipolar transistor. However, other circuit elements like MOS transistors, elements likes diodes which become conducting when a voltage applied to the substrate exceeds a given value or the like may also be used.

In embodiments of the present invention, a semiconductor device comprises a current path which would become conducting when a voltage on a substrate of the device exceeds a predetermined value. In these embodiments, a switch-off element is provided coupled to the current path, said switch-off element switching off the current path when said given voltage from the substrate is exceeded.

Correspondingly, embodiments of a method according to the present invention comprise switching off such a current path depending on a voltage applied to a substrate of a semiconductor device.

The switch-off element, in an embodiment of the invention, may be a transistor.

Therefore, the embodiments described above may serve to reduce power dissipation and make a failure or destruction of the semiconductor less likely.

Figure 2:
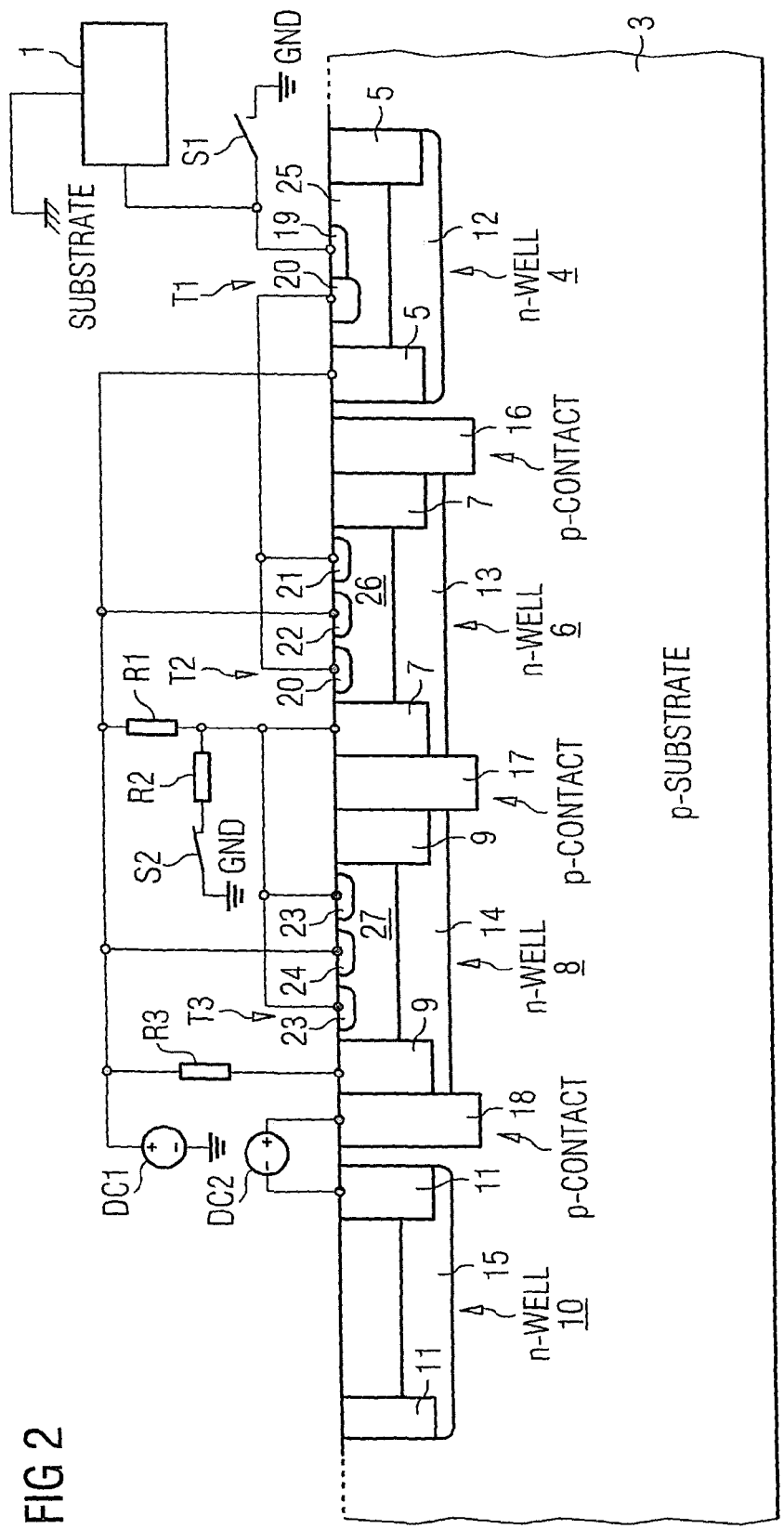
FIG. 2 is a schematic cross section of the layout of transistors of the embodiment of FIG. 1.

To provide a further understanding of the present invention, a further embodiment of the invention will be described with reference to FIGS. 1 and 2. FIG. 1 is a circuit diagram according to an embodiment of the present invention, and FIG. 2 schematically shows a possible layout for transistors T1-T4 of the embodiment of FIG. 1.

The embodiment shown in FIG. 1 is a voltage supply switch for supplying a circuit or device 1 alternatively with ground GND or with a higher voltage supplied by a voltage source DC1. To switch between these two possibilities, switches S1 and S2 are provided which are coupled as indicated by the dashed line in FIG. 1 such that when S1 is closed, S2 is opened and vice versa. The switching device itself in the embodiment of FIG. 1 comprises, in addition to the switches S1 and S2, transistors T1 and T2 and resistors R1 and R2. In the embodiment shown, transistor T1 is a npn-bipolar transistor and transistor T2 is a pnp-bipolar transistor.

The operation of the voltage switch circuit shown is as follows:

When S1 is closed and S2 is open, circuit node 2 which is coupled to device 1 is connected to ground GND. On the other hand, since S2 is opened, the base of transistor T2 is drawn to the positive supply voltage supplied by voltage source DC1. Since T2 is a pnp transistor, this means that T2 is high ohmic between its collector and emitter or in other words is in a blocking state. Consequently, the base of transistor T1 is disconnected from the positive voltage supplied by voltage source DC1 and is also non-conducting or blocking between collector and emitter, such that circuit node 2 is disconnected from the positive voltage supplied by voltage source DC1.

Therefore, circuit node 2 is on ground potential, and ground is supplied to device 1 as a supply voltage.

On the other hand, if switch S2 is closed and switch S1 is open (the state depicted in FIG. 1), ground is disconnected from circuit node 2 since switch S1 is open. On the other hand, the potential at the base of transistor T2 is drawn to a value between the positive voltage defined by voltage source DC1 and ground determined by resistors R1 and R2 which serve as a voltage divider in this case. The voltage or potential then present at the base of T2 is chosen such that T2 becomes conducting. The exact values of R1 and R2 used to achieve this depend on the voltage supplied by voltage source DC1 and the exact type of transistor T2. In addition, it is desirable to assign large values to resistors R1 and R2 to minimize the leakage current flowing across these resistors when S2 is closed.

As an example, when DC1 supplies a voltage of +100 V and ground GND is on a potential of +0 V, and furthermore transistor T2 is designed such that in these circumstances it becomes conducting or low ohmic at a voltage at its base of +5 V R1 may have a resistance of 950 kΩ and R2 may have a resistance of 50 kΩ. In this case, the total resistance between the positive voltage supplied by DC1 and ground is still 1 MΩ when S2 is closed such that only a small current flows, and a voltage of 5 V is supplied to the base of T2 in this case. However, these values are to be understood as an example only, and depending on the voltages to be supplied and the circuit elements used other values may be chosen as well.

When transistor T2 becomes low ohmic between emitter and collector, the base of transistor T1 is drawn to the voltage supplied by voltage source DC1. Since T1 in the embodiment shown is a npn transistor, it becomes low ohmic between emitter and collector and therefore circuit node 2 is connected to the voltage supplied by voltage source DC1. This voltage is then supplied to device 1.

Since in this case S1 as mentioned above is open, no current flows between supply voltage source DC1 and ground via transistor T1.

As a matter of course, such a supply voltage switch may be used for alternatively supplying other voltages than a positive voltage and ground to device 1, or may be extended to more than two different supply voltages.

Turning now to FIG. 2, an exemplary realization of the supply voltage switch of FIG. 1 in an integrated semiconductor device is shown, wherein in FIG. 2 only the layout of transistors T1-T4 is depicted. The remaining circuit elements like resistors may be implemented for example by polysilicon resistors or the like, whereas switches S1 and S2 may also be implemented as transistors like MOS transistors or bipolar transistors.

The semiconductor device shown in FIG. 2 is implemented on a p-type substrate, for example a boron-doped silicon substrate.

For forming the transistors, n-wells are formed for example by ion implantation and/or diffusion. A first n-well 4 is formed by a base portion 12 and a ring-shaped portion 5 (of which two columns are depicted in the sectional view of FIG. 2) connecting the base portion 12 with the surface of the substrate 3. Base portion 12 may for example be ion implantation with n-type dopants like phosphorous or arsenic, whereas ring portion 5 may be formed by diffusion of the same dopants such that both ring portion 5 and base portion 12 are n-doped or highly n-doped. In a similar manner, a second n-well 6 is formed by a base portion 13 and a ring portion 7, a third n-well is formed by a base portion 14 and ring portion 9 and a fourth n-well 10 is formed by a base portion 15 and a ring portion 11.

Additionally, between the n-wells 4, 6, 8, and 10, p-doped regions 16, 17, and 18 are provided for contacting the substrate 3 and for insulating the n-wells against each other.

In the first n-well 4, the first transistor T1 is formed. In the embodiment shown, the first n-well 4 encompasses a p-doped region 25 with a highly p-doped contact 20 forming the base of the transistor, an n-doped region 19 forming the emitter of transistor T1, whereas the collector is formed by the first n-well 4 itself and is contacted via ring portion 5 as shown in FIG. 2.

Transistor T2 is formed in the second n-well 6. Second n-well 6 has an n-doped region 26 formed therein. Furthermore, a p-doped region 22 serving as emitter of transistor T2 and a ring-like p-doped region 21 serving as collector of T2 is formed. N-well 6 itself serves as base for pnp transistor T2. Such a transistor design is also labeled lateral design, such that transistor T2 is a lateral pnp transistor.

It should be noted as a matter of course in a practical realization metal contacts, insulation layers and the like would be present in the device shown in FIG. 2. However, these elements are not necessary for understanding the embodiment shown and are therefore omitted in the figure.

As can be seen in FIG. 2, parasitic npn bipolar transistors are by any two n-wells 4, 6, 8, 10 and the p-substrate 3, p-substrate 3 serving as the base and two n-wells serving as emitter and collector. Such a parasitic transistor is also shown in FIG. 1 and labeled T4, wherein for T4 the fourth n-well 10 serves as emitter and n-wells 6 and 8 serve as collectors, wherein the significance of the third n-well 8 will be explained later.

When the emitter of transistor T4 is biased negative with respect to the substrate 3 as symbolized by a voltage source DC2 in FIGS. 1 and 2, as can be best seen by analyzing FIG. 1 the following problem may occur in a situation where S1 is closed and S2 is opened: Since, through the bias by voltage source DC2, transistor T4 becomes low ohmic, the negative polarity of voltage source DC2 is connected via transistor T4 with the base of transistor T2. This may have the effect that transistor T2 at least becomes partially conducting or open, and in turn transistor T1 becomes partially conducting or open. On the one hand, this raises the voltage and circuit node 2 toward the positive voltage supplied by supply voltages DC1, and therefore an incorrect voltage is supplied to device 1. Furthermore, as T1 becomes at least partially conducting and S1 is closed, a current may flow from DC1 via transistor T1 and switch S1 to ground which leads to an increase in power dissipation and, in case of a high voltage supplied by voltage supply DC1, even to the destruction of transistor T1 due to a high current. In this respect, it should be noted that in some devices like subscriber line interface circuits (SLIC) supply voltages of a 100 V or above are used and already currents of 100 mA may exceed the capacity of a typical transistor and lead to its destruction.

In this respect, it should be noted that voltage source DC2 may be a voltage source used for biasing the substrate such that parasitic transistor T4 does not become conducting but which may exhibit variations, for example due to external influences, such that T4 actually becomes conducting as described above. On the other hand, voltage source DC2 may also be some kind of external voltage accidentally connected to the device.

In the embodiment shown in FIGS. 1 and 2, to counteract this undesirable effect of parasitic transistor T4 a further transistor T3 is provided as shown in FIG. 1. In particular, the base of transistor T3 is connected on the one hand to the collector of parasitic transistor T4 and on the other hand via a resistor R4 with voltage source DC1. The emitter of T3 is connected with the voltage source DC1, and the collector of T3 is connected with the base of transistor T2.

In the embodiment shown, as can be seen in FIG. 2 transistor T2 is realized in the third n-well 8 in a similar manner as T2 is realized in the second n-well 6, i.e. as a lateral pnp transistor. In particular, within n-well 8 an n-doped region 27 similar to n-doped region 26 is provided, and the p-doped region 24 serving as emitter of transistor T3 and a p-doped ring-shaped region 23 serving as collector of transistor T3 is formed. Third n-well 8 itself serves as the base of transistor T3. Since, on the other hand, parasitic transistor T4 is also formed by fourth n-well 10, p substrate 3 and third n-well 8, the connection of T3 to T4 as shown in FIG. 1 is made.

The function of T3 is as follows:

When T4 is not conducting, i.e. the above-mentioned effect does not occur, the base of T3 is biased at the positive supply voltage provided by voltage source DC1 via resistor R3. Since T3 is a pnp transistor, this means that T3 is high ohmic and therefore does not influence the voltage on the base of transistor T2 and therefore does not influence the operation supply voltage switch.

On the other hand, when T4 becomes conducting, similar to the effect explained above for transistor T2 also the voltage on the base of T3 is drawn towards a negative value as defined by the negative polarity of voltage source DC2 and therefore, transistor T3 becomes conducting. In this case, T3 provides a low ohmic bypass to resistor R1 thus strengthening the coupling of transistor T2 with the positive supply voltage supplied by voltage source DC1. Therefore, the voltage on the base of transistor T2 is kept closer to the positive supply voltage supplied by voltage source DC1 when transistor T4 becomes conducting.

In particular, it should be noted that since the base region of transistor T4 is the p-substrate 3 and therefore relatively large, even in a conducting state transistor T4 has, in the embodiment shown, a higher resistance than transistor T3 in its conducting state and therefore, in this case, the voltage source DC1 is coupled via a lower resistance to the base of transistor T2 than the voltage source DC2. Consequently, the voltage at the base of T2 remains at a higher level than without the transistor T3 which prevents transistor T2 from becoming conducting. Since T2 does not become conducting in this case, also T1 is not switched on.

To ensure this effect, R3 should be chosen to be equal to or larger than resistor R1 such that, when transistor T2 would become conducting without transistor T3, transistor T3 also becomes conducting to counteract this effect.

In summary, in the embodiment shown in FIG. 1, through providing transistor T3 the effect of parasitic transistor T4 when a voltage like the one provided by voltage source DC2 is applied is countered.

The present invention is not limited to the embodiment shown. In particular, while the embodiment of FIGS. 1 and 2 shows a voltage supply switch, the principle of the embodiment of FIGS. 1 and 2 may be employed in other embodiments where a switching element like transistor T1 or transistor T2 may be accidentally opened by a corresponding substrate voltage or in embodiments where a current path like the path between voltage source DC1 and ground via transistor T1 may be inadvertently or accidentally opened by a voltage supplied to a substrate. In these cases, an element like transistor T3 which is also controlled by the substrate voltage (via T4 in the embodiment of FIG. 1) to counteract the effect of the substrate voltage and to keep the switching element or the current path securely closed may be employed.

Furthermore, the present invention is not limited to the transistor types shown in FIG. 1. For example, in another embodiment, all the polarities may be reversed, a semiconductor device according to an embodiment may be based on an n-type substrate with p-type wells. Also, switching elements other than bipolar transistors may be used.

It should be noted that in the embodiment of FIGS. 1 and 2, when S1 is opened and S2 is closed transistor T3, in case T4 becomes conducting, raises the voltage at the base of T2 somewhat such that the conductivity of T2 and thus also the conductivity of T1 is reduced. This further reduces leakage currents and power dissipation by current flowing via T1 from voltage source DC1 without otherwise impeding the functionality of the embodiment shown.

Accordingly, while the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A semiconductor device comprising:
  a substrate;
  a switching element including a control input coupled to the substrate; and
  a compensation element including a control input and an output, wherein the control input of the compensation element is coupled to the substrate and the output of the compensation element is coupled to the control input of the switching element;

wherein at least one of said control input of said switching element and said control input of said compensation element is coupled to said substrate via a parasitic element, said parasitic element comprising a bipolar transistor having a base formed by said substrate.

2. The semiconductor device of claim 1 wherein the compensation element and the switching element are configured such that, when a voltage applied to said substrate exceeds a predetermined value, the compensation element controls the control input of the switching element such that the switching element does not switch to a conducting state even if without the compensation element the voltage applied to the substrate would cause the switching element to switch to a conducting state.

3. A semiconductor device comprising:
a substrate having a first polarity;
a first well formed in said substrate, said first well having a second polarity different from said first polarity;
a second well formed in said substrate, said second well having said second polarity;
a first bipolar transistor formed in said first well, said first well forming the base of said first bipolar transistor;
a second bipolar transistor formed in said second well, said second well forming the base of said second bipolar transistor, wherein a collector of said first bipolar transistor is connected with said base of said second bipolar transistor.

4. The semiconductor device of claim 3 wherein said first well is connected to a voltage source via a first resistance, and wherein said second well is connected to said voltage source via a second resistance.

5. The semiconductor device of claim 4 wherein said first resistance has a value equal to or larger than said second resistance.

6. The semiconductor device of claim 3 further comprising a third well formed in said substrate, said third well having said second polarity.

7. The semiconductor device of claim 3 wherein at least one of said first transistor and said second transistor is a lateral transistor.

8. A switching device comprising:
a circuit node;
a first switch coupled between said circuit node and a first supply voltage;
a switching element coupled between said circuit node and a second supply voltage, said switching element including a control input;
a second switch coupled to said control input of said switching element;
a substrate wherein said control input of said switching element is coupled to said substrate; and
a compensation element including a control input and an output, said control input of said compensation element coupled to said substrate and said output of said compensation element coupled to said control input of said switching element.

9. The switching device of claim 8,
wherein said switching element comprises a first transistor and a second transistor,
wherein a control input of said second transistor is coupled to said control input of said switching element;
wherein a control input of said first transistor is coupled to a first contact of said second transistor;
wherein a first contact of said first transistor is coupled to said circuit node; and
wherein a second contact of said first transistor and a second contact of said second transistor are coupled to said second supply voltage.

10. The switching device of claim 9,
wherein said compensation element comprises a third transistor,
wherein a control input of said third transistor is coupled to said substrate and to said first supply voltage,
wherein a first contact of said third transistor is coupled with a set control input of said switching device, and
wherein a second contact of said third transistor is coupled with said second supply voltage.

11. The switching device of claim 10,
wherein said control input of said switching element is coupled with said second supply voltage via a resistor, and
wherein said control input of said third transistor is coupled to said second supply voltage via a further resistor.

12. The switching device of claim 10,
wherein at least one of said first transistor, said second transistor and said third transistor is a bipolar transistor.

13. The switching device of claim 8,
further comprising a parasitic element including said substrate and at least a part of said switching element;
wherein said switching element is coupled to said substrate via said parasitic element.

14. The switching device of claim 13 wherein said parasitic element is a bipolar transistor.

15. A method for compensating substrate effects in a semiconductor device, the method comprising:
providing a substrate;
providing a switching element;
coupling a control input of said switching element to said substrate;
providing a compensation element; and
coupling a control input of said compensation element with said substrate and coupling an output of said compensation element with said control input of said switching element; and
wherein at least one of said control input of said switching element and said control input of said compensation element is coupled to said substrate via a parasitic element, said parasitic element comprising a bipolar transistor having a base formed by said substrate.

16. The method of claim 15 wherein, when a voltage applied to said substrate exceeds a predetermined value, said compensation element controls the control input of said switching element such that said switching element does not switch to a conducting state even if without the compensation element the voltage applied to the substrate would cause the switching element to switch to a conducting state.

17. The method according to claim 15
wherein said compensation element comprises a transistor,
wherein providing said compensation element comprises providing a well in said substrate as a base portion of said transistor with a different polarity than a polarity of said substrate,
wherein said well is coupled with a supply voltage, and
wherein a collector of said transistor is coupled with said control input of said switching element.

* * * * *